US012777864B2

(12) United States Patent
Su

(10) Patent No.: US 12,777,864 B2
(45) Date of Patent: Oct. 27, 2026

(54) METHOD OF FORMING SEMICONDUCTOR STRUCTURE

(71) Applicant: NANYA TECHNOLOGY CORPORATION, New Taipei City (TW)

(72) Inventor: Cheng Chieh Su, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 419 days.

(21) Appl. No.: 18/619,526

(22) Filed: Mar. 28, 2024

(65) Prior Publication Data

US 2025/0308924 A1 Oct. 2, 2025

(51) Int. Cl.
*H10P 50/00* (2026.01)

(52) U.S. Cl.
CPC .............. *H10P 50/73* (2026.01); *H10P 50/71* (2026.01)

(58) Field of Classification Search
CPC ................................ H10P 50/73; H10B 12/03
See application file for complete search history.

(56) References Cited

U.S. PATENT DOCUMENTS

2019/0181014 A1* 6/2019 Chang ................ H10D 84/0147

* cited by examiner

*Primary Examiner* — Shih Tsun A Chou
(74) *Attorney, Agent, or Firm* — CKC & Partners Co., LLC

(57) ABSTRACT

A method of forming a semiconductor structure includes forming a polysilicon layer and a dielectric layer on a top layer of a dielectric stack in sequence; etching the polysilicon layer and the dielectric layer to form plurality of holes, wherein the holes are located in an array area; forming a buffer layer in the array area to fill the holes and cover the dielectric layer; etching back the dielectric layer and a portion of the polysilicon layer in sequence; removing the buffer layer; etching the dielectric stack to extend the holes to a bottom layer of the dielectric stack; and etching the polysilicon layer in the array area and a peripheral area adjacent to the array area, such that a top surface of the polysilicon layer in the array area is coplanar with a top surface of the polysilicon layer in the peripheral area.

20 Claims, 8 Drawing Sheets

METHOD OF FORMING SEMICONDUCTOR STRUCTURE

BACKGROUND

Field of Invention

The present disclosure relates to a method of forming a semiconductor structure.

Description of Related Art

A semiconductor structure associated with a capacitor has an array area and a peripheral area. The formation of the semiconductor structure may include forming a polysilicon layer and an oxide layer on a dielectric stack, forming holes in the oxide layer and the polysilicon layer in the array area, etching the oxide layer, and etching the dielectric stack to extend the holes in a bottom layer of the dielectric stack.

After etching the dielectric stack to extend the holes, the thickness of the polysilicon layer in the array area is less than the thickness of the polysilicon layer in the peripheral area, and thus the polysilicon layer has a height difference between the array area and the peripheral area. However, the height difference of the polysilicon layer causes the following process time longer for etching the polysilicon layer, and the edge of the array area may have defect issue.

SUMMARY

According to some embodiments of the present disclosure, a method of forming a semiconductor structure includes forming a polysilicon layer and a dielectric layer on a top layer of a dielectric stack in sequence; etching the polysilicon layer and the dielectric layer to form plurality of holes, wherein the holes are located in an array area, and the top layer of the dielectric stack is exposed through the holes; forming a buffer layer in the array area to fill the holes and cover the dielectric layer; etching back the dielectric layer and a portion of the polysilicon layer in a peripheral area adjacent to the array area in sequence, wherein the buffer layer on a top surface of the dielectric layer in the array area is thinned; removing the buffer layer; etching the dielectric stack to extend the holes to a bottom layer of the dielectric stack, wherein the dielectric layer is removed during etching the dielectric stack; and etching the polysilicon layer in the array area and the peripheral area, such that a top surface of the polysilicon layer in the array area is coplanar with a top surface of the polysilicon layer in the peripheral area.

In some embodiments, forming the buffer layer in the array area includes forming the buffer layer to cover the dielectric layer in the array area and the peripheral area; and patterning the buffer layer to expose the dielectric layer in the peripheral area.

In some embodiments, patterning the buffer layer is performed such that a top surface of the buffer layer is higher than a top surface of the dielectric layer in the peripheral area.

In some embodiments, the dielectric layer and the portion of the polysilicon layer in the peripheral area are etched back in sequence by using the buffer layer as a mask.

In some embodiments, etching back the dielectric layer and the portion of the polysilicon layer is performed such that the top surface of the polysilicon layer in the peripheral area is lower than the top surface of the polysilicon layer in the array area.

In some embodiments, removing the buffer layer is performed such that the top surface of the dielectric layer in the array area is exposed.

In some embodiments, before etching the dielectric stack, the top surface of the dielectric layer in the array area is higher than the top surface of the polysilicon layer in the peripheral area.

In some embodiments, etching the polysilicon layer and the dielectric layer to form the holes is performed such that the top surface of the dielectric layer in the array area is lower than a top surface of the dielectric layer in the peripheral area.

In some embodiments, a material of the dielectric layer comprises oxide, and a material of the top layer of the dielectric stack comprises nitride.

In some embodiments, the dielectric stack further comprises an oxide layer below the top layer and having a same material as the dielectric layer.

In some embodiments, the dielectric stack comprises a first nitride layer, a boro-phospho-silicate-glass (BPSG) layer, and a second nitride layer that are below the oxide layer. The first nitride layer is the bottom layer of the dielectric stack.

In some embodiments, etching the dielectric stack is performed such that the oxide layer and the dielectric layer are etched simultaneously.

According to some embodiments of the present disclosure, a method of forming a semiconductor structure includes forming a polysilicon layer and a dielectric layer on a top layer of a dielectric stack in sequence; etching the polysilicon layer and the dielectric layer to form plurality of holes, wherein the holes are located in an array area, and the top layer of the dielectric stack is exposed through the holes; forming a buffer layer in the array area and a peripheral area adjacent to the array area to fill the holes and cover the dielectric layer; patterning the buffer layer to expose the dielectric layer in the peripheral area; etching back the dielectric layer and a portion of the polysilicon layer in the peripheral area in sequence, wherein the buffer layer on a top surface of the dielectric layer in the array area is thinned; removing the buffer layer; etching the dielectric stack to extend the holes to a bottom layer of the dielectric stack, wherein the dielectric layer is removed during etching the dielectric stack; and etching the polysilicon layer in the array area and the peripheral area, such that a top surface of the polysilicon layer in the array area is coplanar with a top surface of the polysilicon layer in the peripheral area.

In some embodiments, patterning the buffer layer is performed such that a top surface of the buffer layer is higher than a top surface of the dielectric layer in the peripheral area.

In some embodiments, the dielectric layer and the portion of the polysilicon layer in the peripheral area are etched back in sequence by using the buffer layer as a mask.

In some embodiments, etching back the dielectric layer and the portion of the polysilicon layer is performed such that the top surface of the polysilicon layer in the peripheral area is lower than the top surface of the polysilicon layer in the array area.

In some embodiments, removing the buffer layer is performed such that the top surface of the dielectric layer in the array area is exposed.

In some embodiments, before etching the dielectric stack, the top surface of the dielectric layer in the array area is higher than the top surface of the polysilicon layer in the peripheral area.

In some embodiments, etching the polysilicon layer and the dielectric layer to form the holes is performed such that the top surface of the dielectric layer in the array area is lower than a top surface of the dielectric layer in the peripheral area.

In some embodiments, the dielectric stack further comprises an oxide layer below the top layer and having a same material as the dielectric layer, and etching the dielectric stack is performed such that the oxide layer and the dielectric layer are etched simultaneously.

In the aforementioned embodiments of the present disclosure, since the method of forming the semiconductor structure includes forming the buffer layer in the array area to fill the holes and cover the dielectric layer, the dielectric layer and the polysilicon layer in the array area can be remained when etching back the dielectric layer and the portion of the polysilicon layer. As a result, the polysilicon layer has a greater thickness in the array area than in the peripheral area. When etching the polysilicon layer in the array area and the peripheral area, the etching rate for the polysilicon layer in the array area is greater than the etching rate for the polysilicon layer in the peripheral area due to the holes through the polysilicon layer in the array area. Accordingly, after etching the polysilicon layer in the array area and the peripheral area, the top surface of the polysilicon layer in the array area can be coplanar with the top surface of the polysilicon layer in the peripheral area. The polysilicon layer having no height difference between the array area and the peripheral area can reduce the following process time longer for removing the polysilicon layer, and can prevent the defect issue at the edge of the array area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
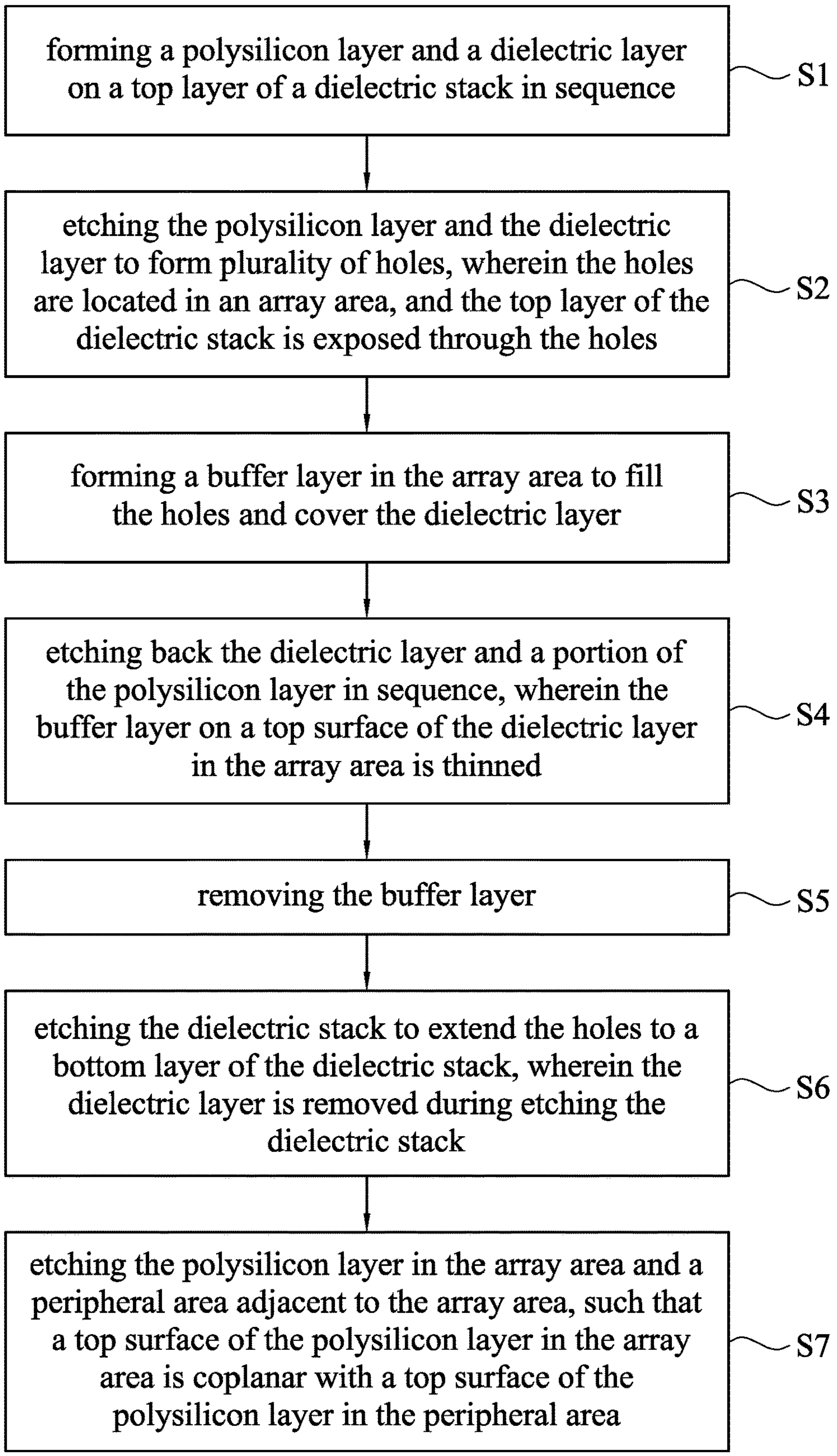
FIG. 1 is a flow chart of a method of forming a semiconductor structure according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart of a method of forming a semiconductor structure according to one embodiment of the present disclosure. The method of forming the semiconductor structure includes the following steps. In step S1, a polysilicon layer and a dielectric layer are formed on a top layer of a dielectric stack in sequence. Thereafter, in step S2, the polysilicon layer and the dielectric layer are etched to form plurality of holes, wherein the holes are located in an array area, and the top layer of the dielectric stack is exposed through the holes. Next, in step S3, a buffer layer is formed in the array area to fill the holes and cover the dielectric layer. Afterwards, in step S4, the dielectric layer and a portion of the polysilicon layer are etched back in sequence, wherein the buffer layer on a top surface of the dielectric layer in the array area is thinned. Subsequently, in step S5, the buffer layer is removed. Thereafter, in step S6, the dielectric stack is etched to extend the holes to a bottom layer of the dielectric stack, wherein the dielectric layer is removed during etching the dielectric stack. Thereafter, in step S7, the polysilicon layer in the array area and a peripheral area adjacent to the array area is etched, such that a top surface of the polysilicon layer in the array area is coplanar with a top surface of the polysilicon layer in the peripheral area.

Moreover, each of steps S1 to S7 may include plural detailed steps, the method may include other steps between step S1 and step S7, and the method may include other steps before step S1 and after step S7. In the following description, the aforementioned steps S1 to S7 will be described.

Figure 2:
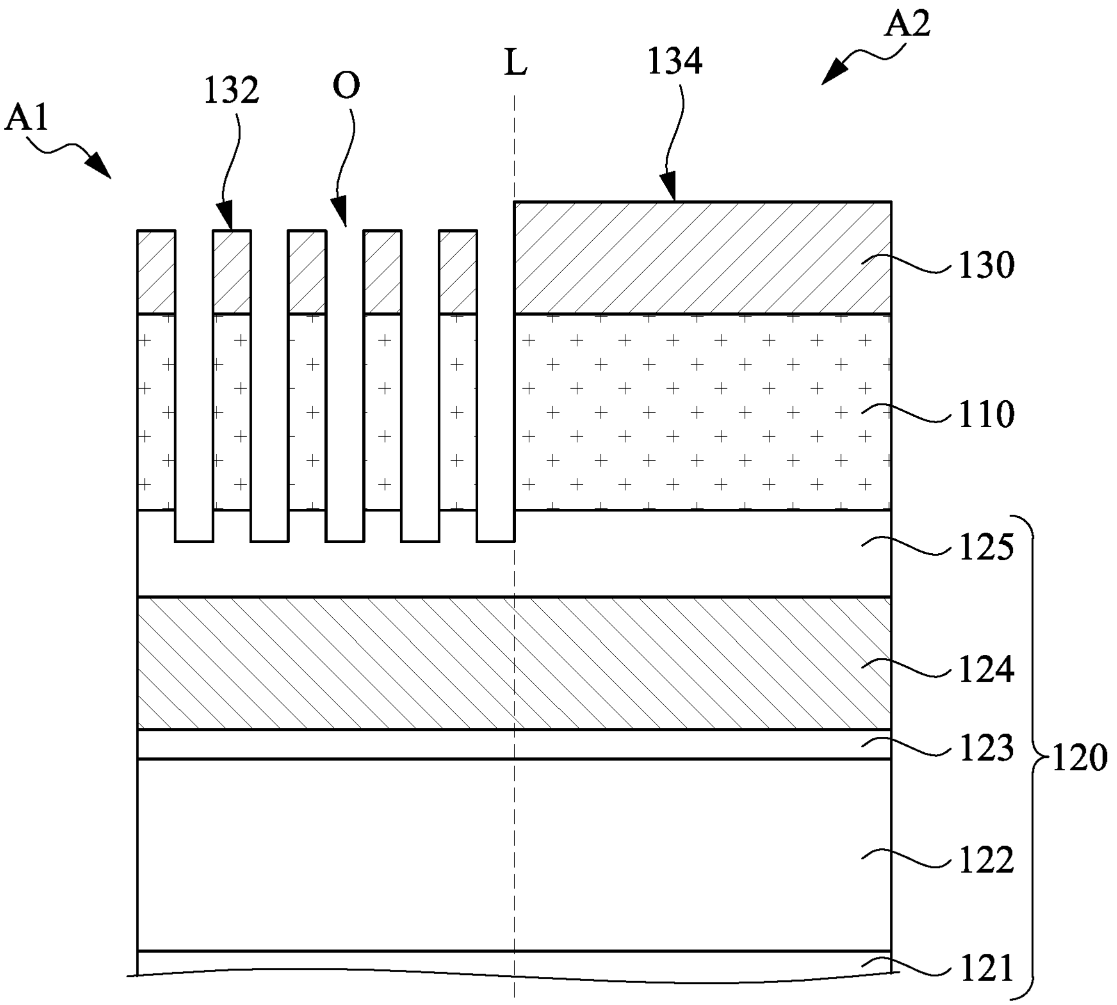
FIGS. 2 to 8 are cross-sectional views at intermediate stages of a method of forming a semiconductor structure according to some embodiments of the present disclosure.

FIGS. 2 to 8 are cross-sectional views at intermediate stages of a method of forming a semiconductor structure according to some embodiments of the present disclosure. As shown in FIG. 2, a polysilicon layer 110 and a dielectric layer 130 are formed on a top layer 125 of a dielectric stack 120 in sequence. The dielectric stack 120 may be located on a semiconductor substrate (e.g., silicon substrate), and may include a first nitride layer 121, a boro-phospho-silicate-glass (BPSG) layer 122, a second nitride layer 123, an oxide layer 124, and the top layer 125. The first nitride layer 121, the BPSG layer 122, and the second nitride layer 123 are located below the oxide layer 124. The first nitride layer 121 is the bottom layer of the dielectric stack 120. The material of the top layer 125 may include nitride. The oxide layer 124 is located below the top layer 125 and has the same material as the dielectric layer 130. In other words, the material of the dielectric layer 130 may include oxide. After the polysilicon layer 110 and the dielectric layer 130 are formed on the top layer 125 of the dielectric stack 120, the polysilicon layer 110 and the dielectric layer 130 are etched to form plural holes O, in which the holes O are located in an array area A1, and the top layer 125 of the dielectric stack 120 is exposed through the holes O. The array area A1 is at the left side of a dotted line L, and a peripheral area A2 adjacent to the array area A1 is at the right side of the dotted line L. The polysilicon layer 110 and the dielectric stack 120 are used to form a capacitor having the array area A1 and the peripheral area A2. In some embodiments, portions of the top layer 125 are etched such that the holes O extend into the top layer 125. In addition, etching the polysilicon layer 110 and the dielectric layer 130 to form the holes O is performed such that the top surface 132 of the dielectric layer 130 in the array area A1 is lower than the top surface 134 of the dielectric layer 130 in the peripheral area A2.

Figure 3:
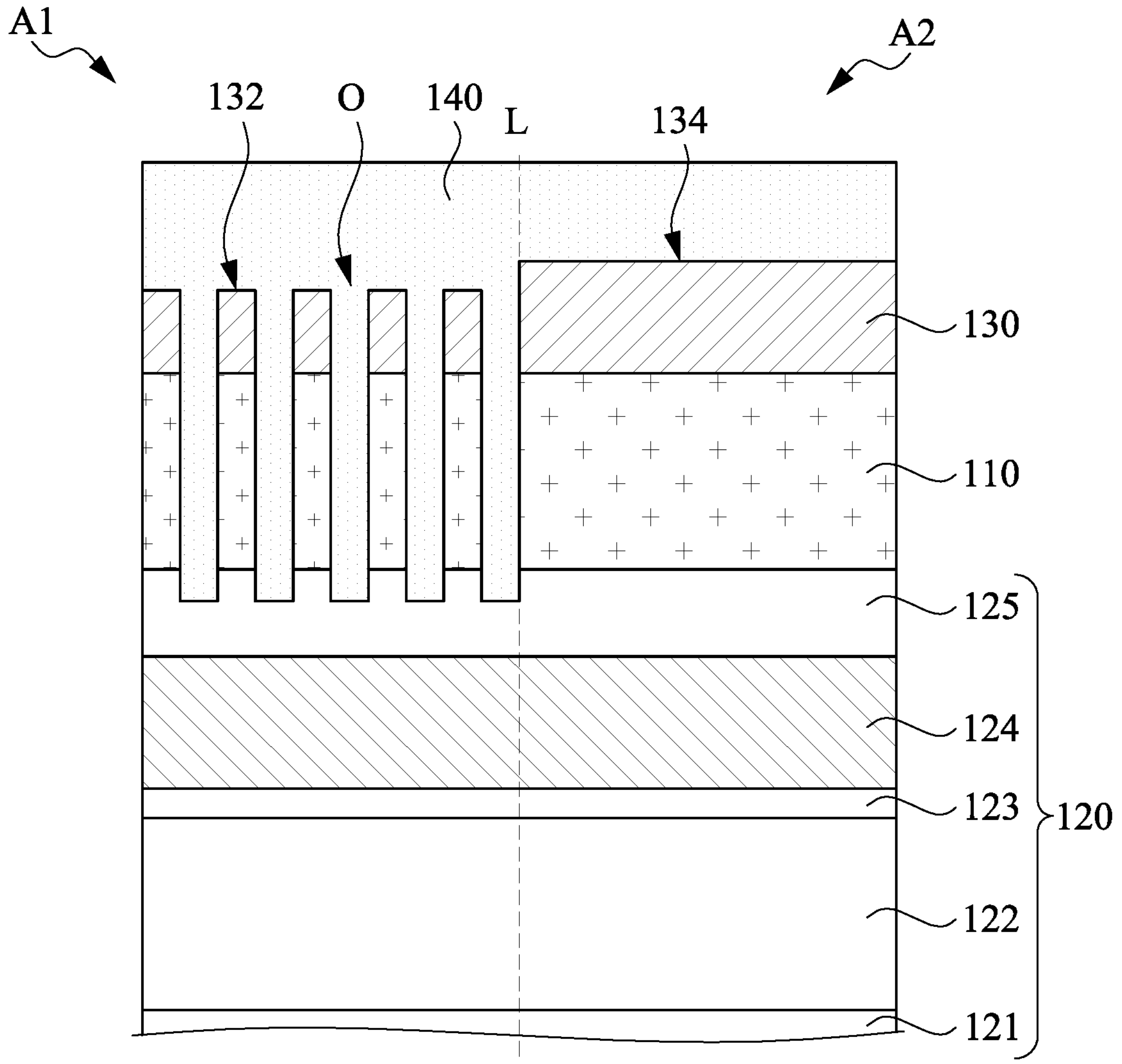
Figure 4:
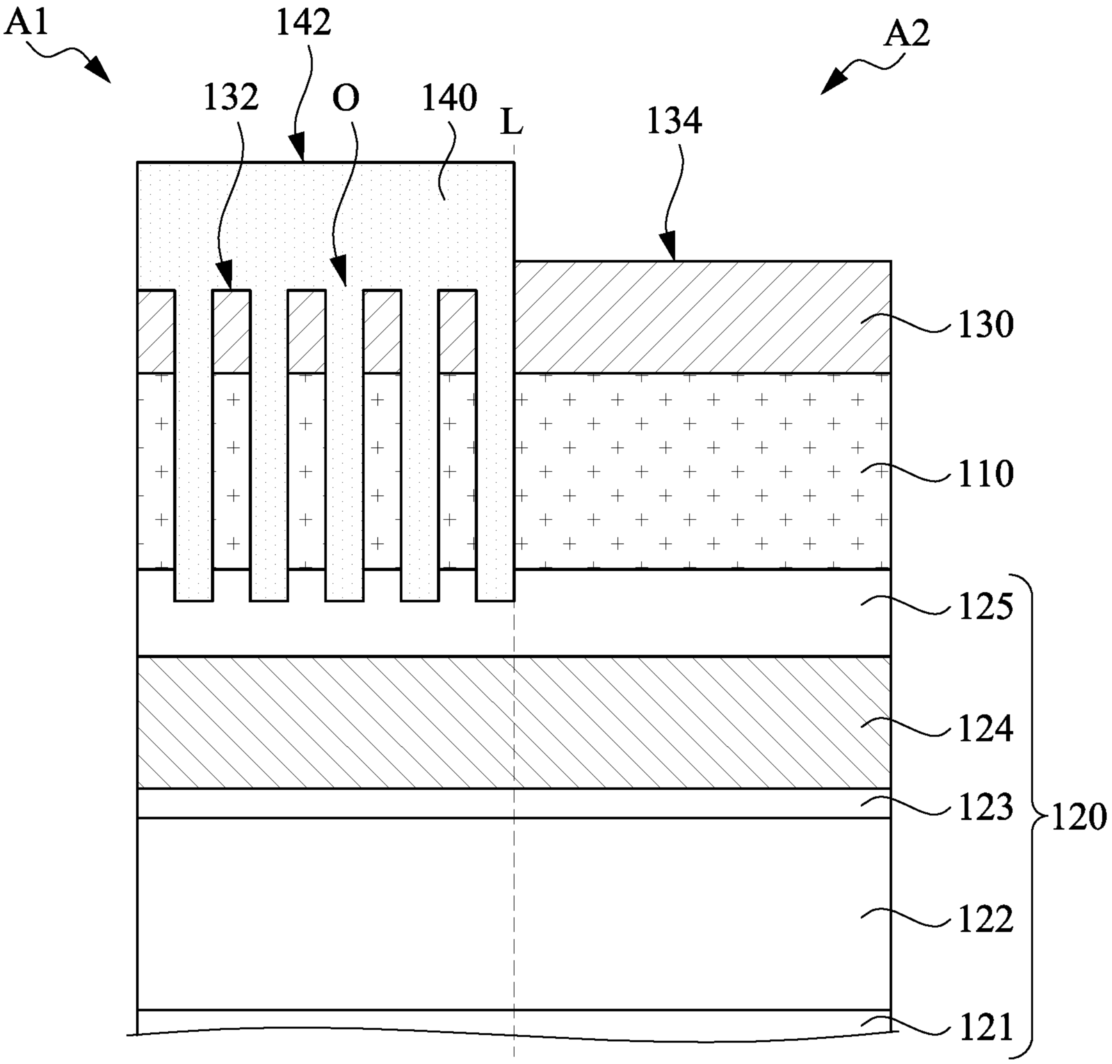

As shown in FIG. 3 and FIG. 4, a buffer layer 140 is formed to cover the dielectric layer 130 in the array area A1 and the peripheral area A2, and then the buffer layer 140 is patterned to expose the dielectric layer 130 in the peripheral area A2. As a result, the buffer layer 140 can be formed in the array area A1 to fill the holes O and cover the dielectric layer 130 in the array area A1. After patterning the buffer layer 140, the top surface 142 of the buffer layer 140 is higher than the exposed top surface 134 of the dielectric layer 130 in the peripheral area A2. In some embodiments, the buffer layer 140 may be photoresist.

Figure 5:
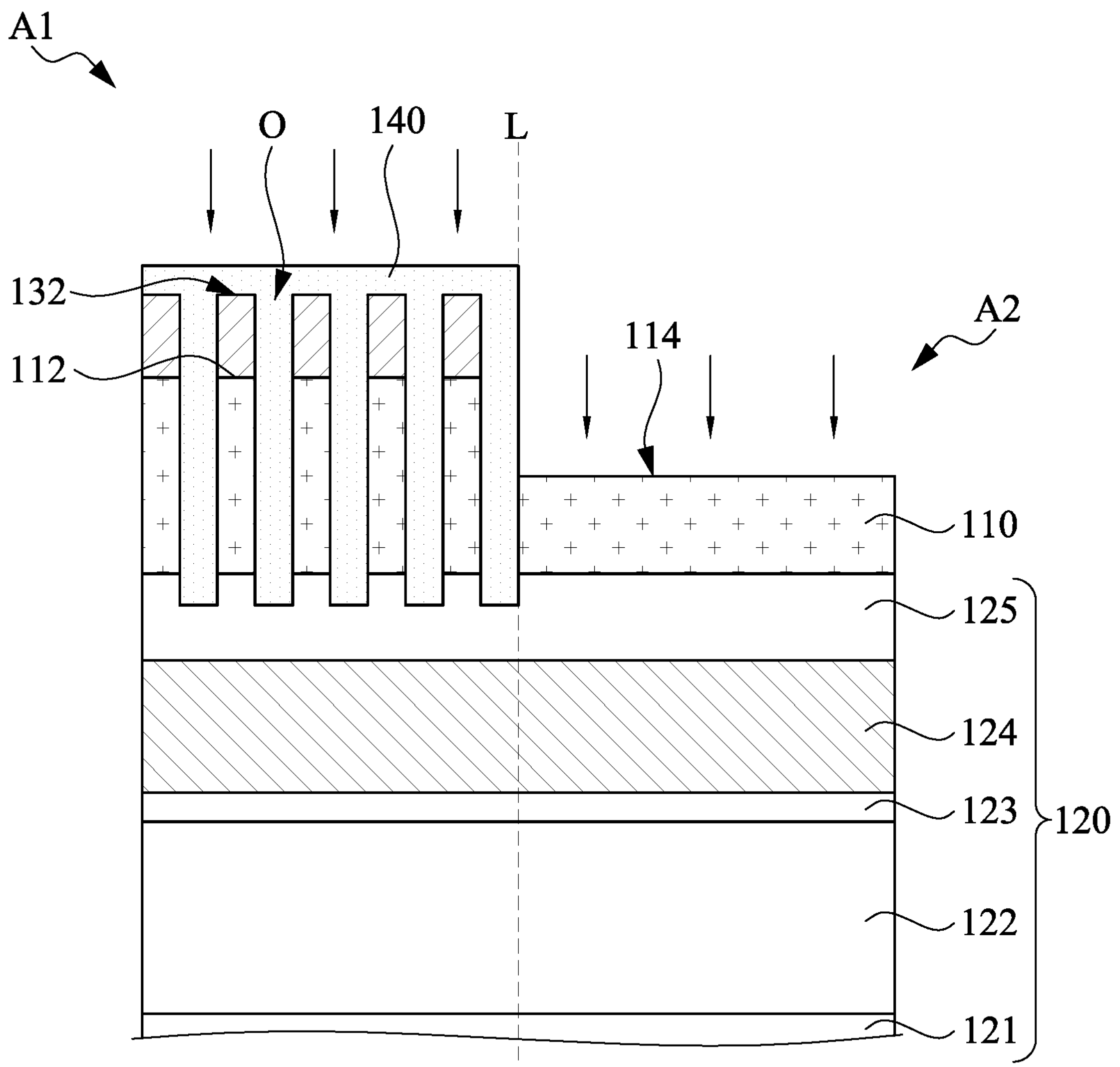

As shown in FIG. 5, the dielectric layer 130 and a portion of the polysilicon layer 110 are etched back in sequence. In addition, the buffer layer 140 on the top surface 132 of the dielectric layer 130 in the array area A1 is thinned because of the etching step. In other words, the dielectric layer 130 and the portion of the polysilicon layer 110 in the peripheral area A2 are etched back in sequence by using the buffer layer 140 as a mask. The buffer layer 140 protects the dielectric layer 130 and the underlying polysilicon layer 110 that are located in the array area A1. Etching back the dielectric layer 130 and the portion of the polysilicon layer 110 is performed such that the top surface 114 of the polysilicon layer 110 in the peripheral area A2 is lower than the top surface 112 of the polysilicon layer 110 in the array area A1.

Figure 6:
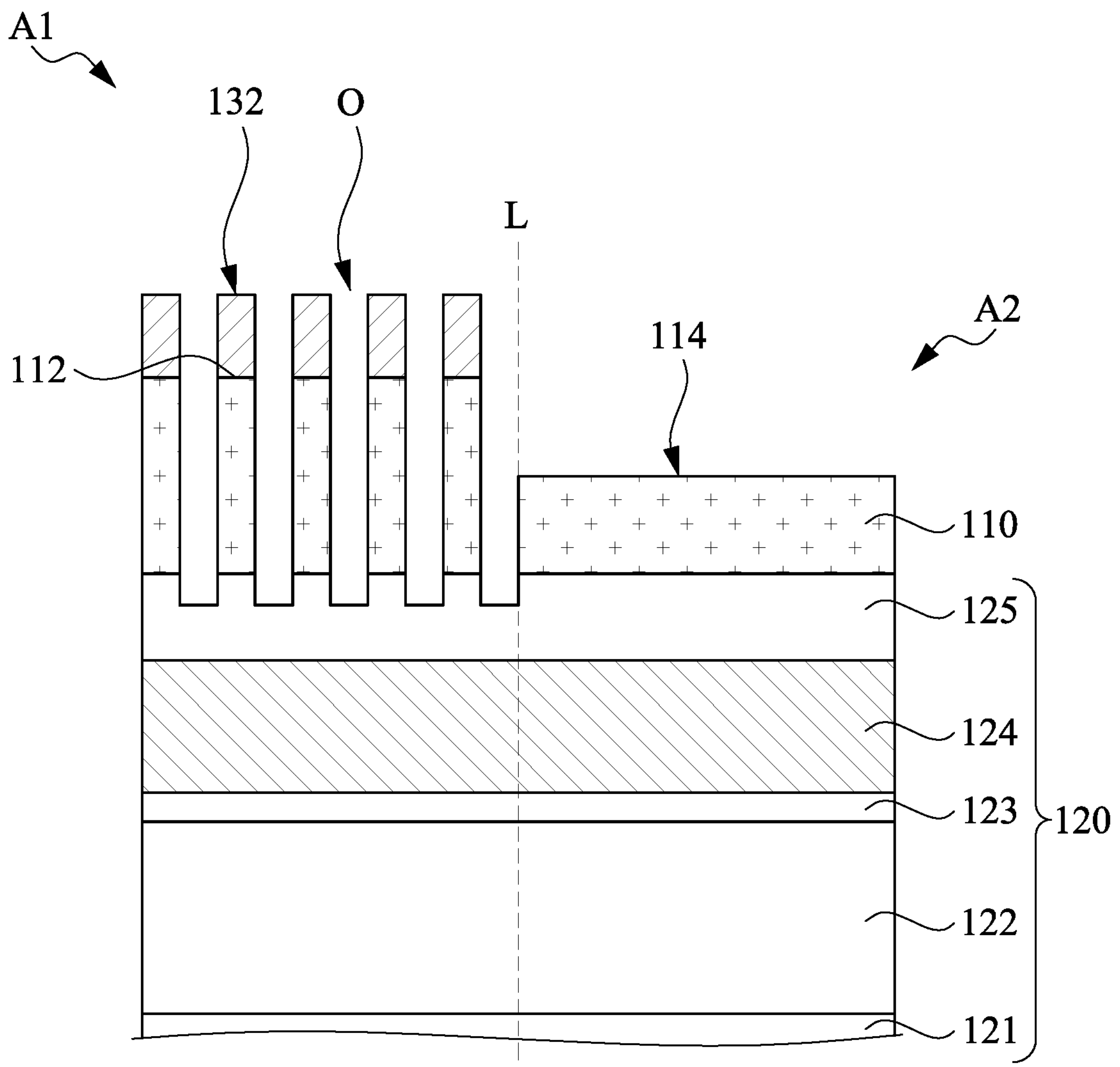

As shown in FIG. 6, thereafter, the buffer layer 140 of FIG. 5 is removed, and removing the buffer layer 140 is performed such that the top surface 132 of the dielectric layer 130 in the array area A1 is exposed. Before performing a following step of etching the dielectric stack 120, the top surface 132 of the dielectric layer 130 in the array area A1 is higher than the top surface 114 of the polysilicon layer 110 in the peripheral area A2.

Figure 7:
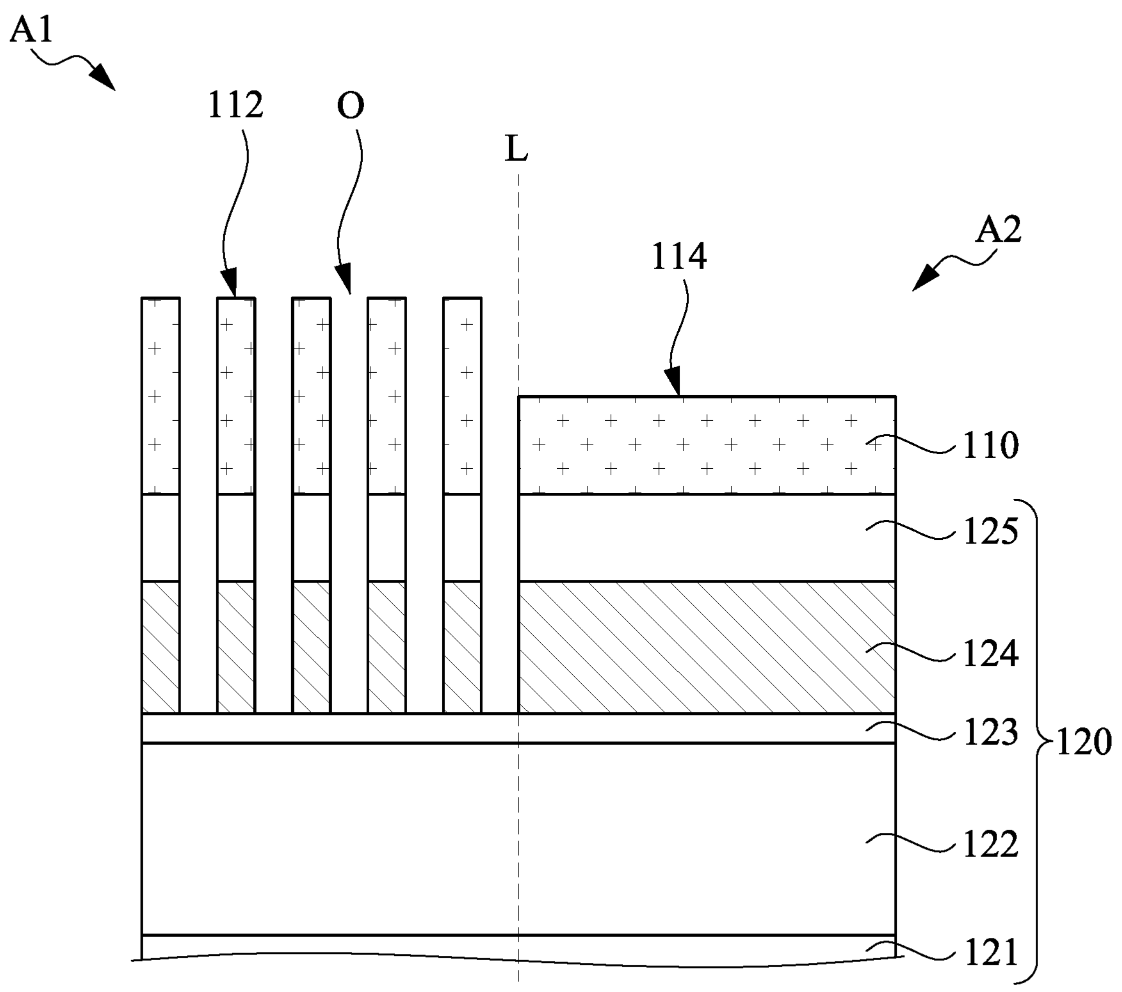
Figure 8:
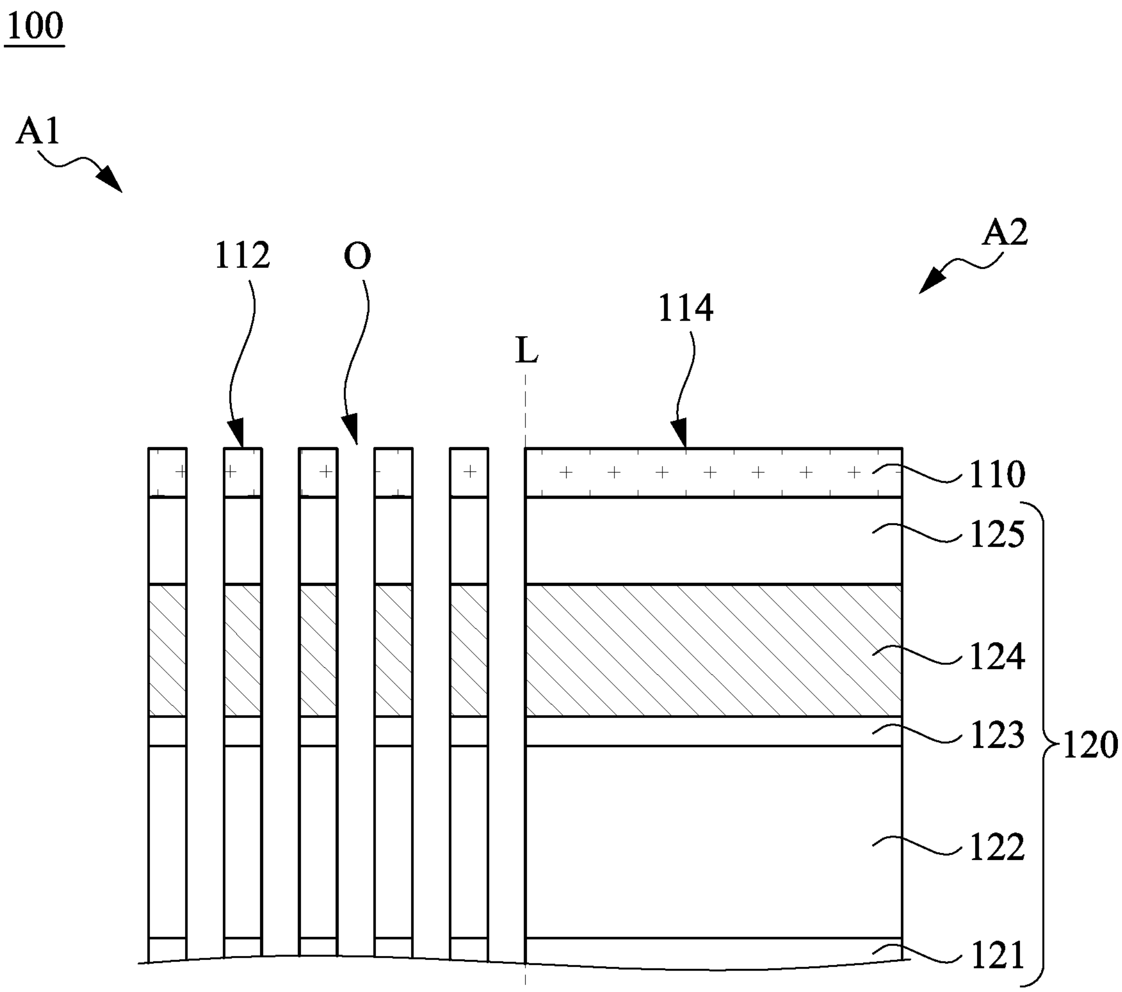

As shown in FIGS. 7 and 8, after removing the buffer layer 140, the dielectric stack 120 is etched to extend the holes O to the bottom layer (i.e., the first nitride layer 121) of the dielectric stack 120. Moreover, because the dielectric layer 130 (see FIG. 6) and the oxide layer 124 have the same material, the dielectric layer 130 is removed during etching the oxide layer 124 of the dielectric stack 120. In other words, etching the dielectric stack 120 is performed such that the oxide layer 124 and the dielectric layer 130 are etched simultaneously. Subsequently, the polysilicon layer 110 in the array area A1 and the peripheral area A2 is etched. Because the etching rate for the polysilicon layer 110 in the array area A1 is greater than the etching rate for the polysilicon layer 110 in the peripheral area A2 due to the holes O through the polysilicon layer 110 in the array area A1, the top surface 112 of the polysilicon layer 110 in the array area A1 is coplanar with the top surface 114 of the polysilicon layer 110 in the peripheral area A2. Accordingly, the semiconductor structure 100 of FIG. 8 can be obtained to utilize in a capacitor.

To sum up, since the method of forming the semiconductor structure 100 includes forming the buffer layer 140 (see FIG. 4) in the array area A1 to fill the holes O and cover the dielectric layer 130, the dielectric layer 130 and the polysilicon layer 110 in the array area A1 (see FIG. 5) can be remained when etching back the dielectric layer 130 and the portion of the polysilicon layer 110. As a result, the polysilicon layer 110 has a greater thickness in the array area A1 than in the peripheral area A2. When etching the polysilicon layer 110 in the array area A1 and the peripheral area A2, the etching rate for the polysilicon layer 110 in the array area A1 is greater than the etching rate for the polysilicon layer 110 in the peripheral area A2 due to the holes O through the polysilicon layer 110 in the array area A1. Accordingly, after etching the polysilicon layer 110 in the array area A1 and the peripheral area A2, the top surface 112 of the polysilicon layer 110 in the array area A1 can be coplanar with the top surface 114 of the polysilicon layer 110 in the peripheral area A2. The polysilicon layer 110 having no height difference between the array area A1 and the peripheral area A2 can reduce the following process time longer for removing the polysilicon layer 110, and can prevent the defect issue at the edge of the array area A1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:

forming a polysilicon layer and a dielectric layer on a top layer of a dielectric stack in sequence;

etching the polysilicon layer and the dielectric layer to form plurality of holes, wherein the holes are located in an array area, and the top layer of the dielectric stack is exposed through the holes;

forming a buffer layer in the array area to fill the holes and cover the dielectric layer;

etching back the dielectric layer and a portion of the polysilicon layer in sequence, wherein the buffer layer on a top surface of the dielectric layer in the array area is thinned;

removing the buffer layer;

etching the dielectric stack to extend the holes to a bottom layer of the dielectric stack, wherein the dielectric layer is removed during etching the dielectric stack; and etching the polysilicon layer in the array area and a peripheral area adjacent to the array area, such that a top surface of the polysilicon layer in the array area is coplanar with a top surface of the polysilicon layer in the peripheral area.

2. The method of forming the semiconductor structure of claim 1, wherein forming the buffer layer in the array area comprises:

forming the buffer layer to cover the dielectric layer in the array area and the peripheral area; and patterning the buffer layer to expose the dielectric layer in the peripheral area.

3. The method of forming the semiconductor structure of claim 2, wherein patterning the buffer layer is performed such that a top surface of the buffer layer is higher than a top surface of the dielectric layer in the peripheral area.

4. The method of forming the semiconductor structure of claim 1, wherein the dielectric layer and the portion of the polysilicon layer in the peripheral area are etched back in sequence by using the buffer layer as a mask.

5. The method of forming the semiconductor structure of claim 1, wherein etching back the dielectric layer and the portion of the polysilicon layer is performed such that the top surface of the polysilicon layer in the peripheral area is lower than the top surface of the polysilicon layer in the array area.

6. The method of forming the semiconductor structure of claim 1, wherein removing the buffer layer is performed such that the top surface of the dielectric layer in the array area is exposed.

7. The method of forming the semiconductor structure of claim 1, wherein before etching the dielectric stack, the top surface of the dielectric layer in the array area is higher than the top surface of the polysilicon layer in the peripheral area.

8. The method of forming the semiconductor structure of claim 1, wherein etching the polysilicon layer and the dielectric layer to form the holes is performed such that the top surface of the dielectric layer in the array area is lower than a top surface of the dielectric layer in the peripheral area.

9. The method of forming the semiconductor structure of claim 1, wherein a material of the dielectric layer comprises oxide, and a material of the top layer of the dielectric stack comprises nitride.

10. The method of forming the semiconductor structure of claim 1, wherein the dielectric stack further comprises an oxide layer below the top layer and having a same material as the dielectric layer.

11. The method of forming the semiconductor structure of claim 10, wherein the dielectric stack comprises a first nitride layer, a boro-phospho-silicate-glass (BPSG) layer, and a second nitride layer that are below the oxide layer, and the first nitride layer is the bottom layer of the dielectric stack.

12. The method of forming the semiconductor structure of claim 10, wherein etching the dielectric stack is performed such that the oxide layer and the dielectric layer are etched simultaneously.

13. A method of forming a semiconductor structure, comprising:

forming a polysilicon layer and a dielectric layer on a top layer of a dielectric stack in sequence;

etching the polysilicon layer and the dielectric layer to form plurality of holes, wherein the holes are located in an array area, and the top layer of the dielectric stack is exposed through the holes;

forming a buffer layer to cover the dielectric layer in the array area and a peripheral area adjacent to the array area to fill the holes;

patterning the buffer layer to expose the dielectric layer in the peripheral area;

etching back the dielectric layer and a portion of the polysilicon layer in sequence, wherein the buffer layer on a top surface of the dielectric layer in the array area is thinned;

removing the buffer layer;

etching the dielectric stack to extend the holes to a bottom layer of the dielectric stack, wherein the dielectric layer is removed during etching the dielectric stack; and etching the polysilicon layer in the array area and the peripheral area, such that a top surface of the polysilicon layer in the array area is coplanar with a top surface of the polysilicon layer in the peripheral area.

14. The method of forming the semiconductor structure of claim 13, wherein patterning the buffer layer is performed such that a top surface of the buffer layer is higher than a top surface of the dielectric layer in the peripheral area.

15. The method of forming the semiconductor structure of claim 13, wherein the dielectric layer and the portion of the polysilicon layer in the peripheral area are etched back in sequence by using the buffer layer as a mask.

16. The method of forming the semiconductor structure of claim 13, wherein etching back the dielectric layer and the portion of the polysilicon layer is performed such that the top surface of the polysilicon layer in the peripheral area is lower than the top surface of the polysilicon layer in the array area.

17. The method of forming the semiconductor structure of claim 13, wherein removing the buffer layer is performed such that the top surface of the dielectric layer in the array area is exposed.

18. The method of forming the semiconductor structure of claim 13, wherein before etching the dielectric stack, the top surface of the dielectric layer in the array area is higher than the top surface of the polysilicon layer in the peripheral area.

19. The method of forming the semiconductor structure of claim 13, wherein etching the polysilicon layer and the dielectric layer to form the holes is performed such that the top surface of the dielectric layer in the array area is lower than a top surface of the dielectric layer in the peripheral area.

20. The method of forming the semiconductor structure of claim 13, wherein the dielectric stack further comprises an oxide layer below the top layer and having a same material as the dielectric layer, and etching the dielectric stack is performed such that the oxide layer and the dielectric layer are etched simultaneously.

* * * * *